United States Patent
Gammel et al.

(10) Patent No.: US 7,494,888 B2
(45) Date of Patent: Feb. 24, 2009

(54) DEVICE AND METHOD USING ISOTOPICALLY ENRICHED SILICON

(75) Inventors: Peter L. Gammel, Millburn, NJ (US); Bailey R. Jones, Mohnton, NJ (US); Isik Kizilyalli, Allentown, PA (US); Hugo F. Safar, Westfield, NJ (US)

(73) Assignee: Agere Systems Inc., Allentown, PA (US)

( * ) Notice: Subject to any disclaimer, the term of this patent is extended or adjusted under 35 U.S.C. 154(b) by 206 days.

(21) Appl. No.: 10/875,029

(22) Filed: Jun. 23, 2004

(65) Prior Publication Data

US 2005/0287786 A1    Dec. 29, 2005

(51) Int. Cl.
  *H01L 21/331*    (2006.01)
(52) U.S. Cl. .............. 438/312; 117/2; 117/928
(58) Field of Classification Search .......... 257/76, 257/183, 347, 352, 798; 438/312, 528; 117/2, 117/928
See application file for complete search history.

(56) References Cited

U.S. PATENT DOCUMENTS

| | | | | |
|---|---|---|---|---|
| 5,144,409 | A | * | 9/1992 | Ma ............................ 257/557 |
| 5,891,242 | A | * | 4/1999 | Pesklak et al. ............... 117/84 |
| 6,653,658 | B2 | * | 11/2003 | Burden ....................... 257/76 |
| 2004/0169225 | A1 | * | 9/2004 | Burden ....................... 257/347 |

* cited by examiner

*Primary Examiner*—David Vu

(57) ABSTRACT

The present invention provides a process for manufacturing a semiconductor device that can be incorporated into an integrated circuit. The method includes, forming a first doped layer of isotopically enriched silicon over a foundational substrate, forming a second layer of an isotopically enriched semiconductor material silicon over the first doped layer, and constructing active devices on the second layer. The device includes a first doped layer of an isotopically enriched semiconductor material and a second layer of an isotopically enriched semiconductor material located over the first doped layer, and active devices located on the second layer.

20 Claims, 5 Drawing Sheets

DEVICE AND METHOD USING ISOTOPICALLY ENRICHED SILICON

TECHNICAL FIELD OF THE INVENTION

The present invention is directed, in general, to semiconductor devices, and more specifically, to a device and method that uses a doped isotopically enriched semiconductive material to enhance heat extraction.

BACKGROUND OF THE INVENTION

As is well known, silicon is an element that is commonly used to fabricate semiconductor wafers. In the naturally occurring forms, silicon is composed of approximately 92.2% of silicon 28 ($^{28}Si$), 4.7% of silicon 29 ($^{29}Si$), and 3.1% of silicon 30 ($^{30}Si$). In naturally occurring semiconductors, such as silicon and germanium, thermal conductivity of the material is limited by the concentration of the isotopic species, for example, $Si^{29}$, $Si^{30}$. Heat distribution and extraction in a semiconductor device is limited by the thermal conductivity of the materials from which it is made. Low thermal conductivity limits the packing density of the transistors on a semiconductor wafer or the amount of power that can be generated in a device without inducing device failure.

This is because one of the limiting factors in the lifetimes of semiconductor devices used especially for high power applications is short device lifetime due to power dissipation in the device causing higher temperature resulting in degradation of the transistor. Other limiting factors include, degraded performance through decreased mobility and increased leakage and reduced reliability through electro-migration, gate oxide breakdown, latch-up and thermal runaway.

In semiconductor devices, particularly silicon devices, it is desirable that the temperature of the silicon does not exceed 200° C. or 150° C. in the case of plastic packages. A 7° C. reduction in this temperature (100° C. nominal) results in a two-fold increase in lifetimes. Thus, many manufacturers have turned to using external cooling methods, such as heatsinks to limit the temperature rise of the device. Other attempts to dissipate heat build up include, spreading the active area of the device, managing power with gated clocks, multiple threshold voltage cells, dynamic substrate bias, package solution to extract heat, and wafer thinning. Further improvements, however, in cooling technology are necessary to allow these devices to be used in various applications, such as microprocessors, digital signal processors, and integrated circuits.

Accordingly, what is needed in the art is a process and device for manufacturing a semiconductor device that does not exhibit the limitations of the prior art.

SUMMARY OF THE INVENTION

To address the above-discussed deficiencies of the prior art, the present invention provides, in one embodiment, a process for manufacturing a semiconductor device. In this embodiment the method includes, forming a first doped layer of isotopically enriched silicon over a foundational substrate, forming a second layer of an isotopically enriched semiconductor material silicon over the first doped layer, and constructing active devices on the second layer.

In another embodiment, the present invention, provides a semiconductor device. In one aspect of this embodiment, the semiconductor device includes a first doped layer of an isotopically enriched semiconductor material and a second layer of an isotopically enriched semiconductor material located over the first doped layer, and active devices located on the second layer.

In yet another embodiment, there is provided an integrated circuit. In this particular embodiment, the integrated circuit includes a first doped layer of isotopically enriched silicon, a second doped layer of isotopically enriched silicon, and active devices located on or within the second doped layer. Dielectric layers are located over the active devices and interconnects are located in dielectric layers that interconnect the active devices to form an operative integrated circuit.

The foregoing has outlined preferred features of the present invention so that those of ordinary skill in the art may better understand the detailed description of the invention that follows. Additional features of the invention will be described hereinafter that form the subject of the claims of the invention. Those of ordinary skill in the art would appreciate that they can readily use the disclosed conception and specific embodiments as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features may not be drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

The present invention recognizes the benefits of using a first layer of an isotopically enriched semiconductor material that is doped and over which a second layer of isotopically enriched semiconductor material is formed. The second layer is used as an active device layer over which and in which active devices are constructed. Because the first isotopically enriched layer is doped, it can serve as an electrical back connection for the semiconductor devices that are formed on the second isotopically enriched layer, and as such, can also serve as the foundational layer for the semiconductor devices. The heat dissipation benefits associated with the isotopically enriched material in both layers also allows for longer device life, and leakage, and increased reliability. Moreover, the present invention can easily be used in addition to other heat dissipation efforts currently being implemented by the semiconductor industry.

Isotopically-enriched silicon 28 ($^{28}$Si) has been shown to have a thermal conductivity 60% to 600% higher than naturally occurring silicon as described in Capinski et al., *Thermal Conductivity of Isotopically-enriched Si*, Applied Physics Letters, v71, pp. 2109-11 (1997), and Ruf et al., *Thermal Conductivity of Isotopically-enriched Silicon, Solid State Communications*, v115, pp. 243-47 (2000), both of which are incorporated herein in their entirety by reference. Isotopically-enriched means that the silicon has a higher proportion of one of the isotopes of silicon than is present in naturally occurring silicon. In one example, it is composed of at least 98% $^{28}$Si.

Isotopically pure germanium has also demonstrated improved thermal conductivity over naturally occurring germanium crystals as described in Ozhogin et al, *Isotope Effects in the Thermal Conductivity of Germanium Single Crystals*, JETP Letters, Vol. 63, No. 6, pp 490-494, (1996), and in Asen-Palmer et al, *Thermal Conductivity of Germanium Crystals with different Isotopic Compositions*, Physical Review B, Vol. 56, No. 15, pp 9431-9447, (1997) incorporated herein in its entirety by reference. In the case of germanium, isotopically-enriched means that the enriched germanium has a higher proportion of one of the isotopes of Ge than is present in naturally occurring germanium (e.g., it is composed of at least 80% germanium 74 ($^{74}$Ge)).

Figure 1:
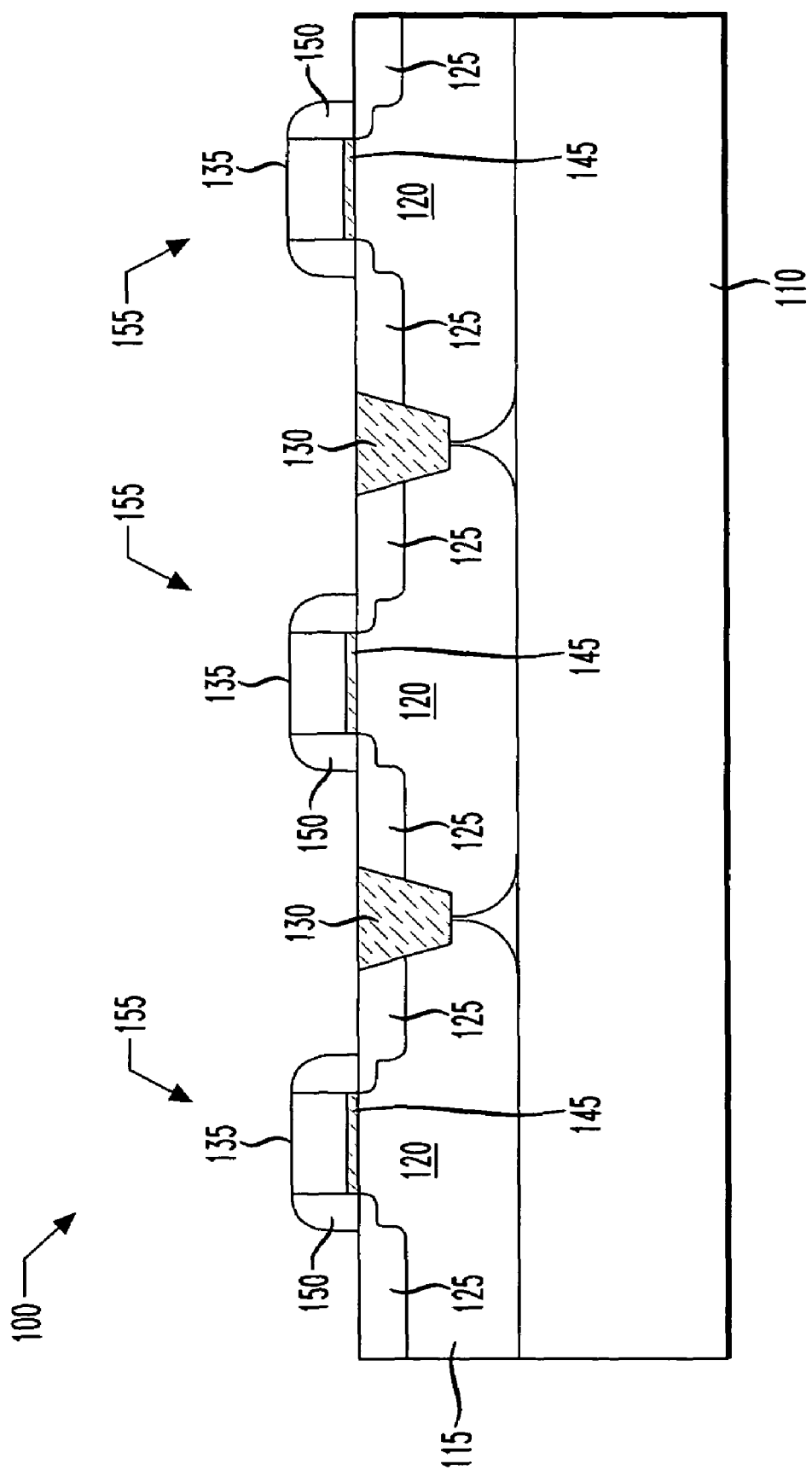
FIG. 1 illustrate a sectional view of a semiconductor device as provided by one embodiment.

Turning initially to FIG. 1, there is illustrated a sectional view of a semiconductor device 100 fabricated in accordance with the present invention. In the illustrated embodiment, the semiconductor device 100 includes an isotopically enriched semiconductor substrate 110. The substrate 110 is doped with one or more dopants. An epi or device layer 115 is located over the substrate 110, and it is also comprised of an isotopically enriched semiconductor material, and in one embodiment, is comprised of the same enriched isotopical semiconductor material that comprises the substrate 110. Device layer 115 preferably includes dopants. The semiconductor device 100 further includes wells 120 and source/drain regions 125 formed within the device layer 115. The wells 120 are electrically isolated by conventionally formed isolation structures 130. Gates 135 are located over the device layer 115 and are isolated from the well 120 and source/drains 125 by a dielectric layer 145. The gate 135 also includes spacers 150. The wells 120, source/drain regions 125, the gates 135, and dielectric layer 145 all form at least a portion of active devices 155.

The design of the semiconductor device 100 may vary, depending on its intended application. For example, the semiconductor device 100 may be configured as a complementary metal oxide semiconductor (CMOS) device, as a radio frequency laterally doped metal oxide semiconductor (RFLDMOS) device, as bipolar device, or other active device used to form an integrated circuit. What should be understood, however, is that the present invention may be applied to many different types of transistor and device designs, and the present invention is not limited to any one specific design. With the semiconductor device 100 having now been generally introduced, a discussion of its fabrication and incorporation into an integrated circuit will now be discussed.

Figure 2:
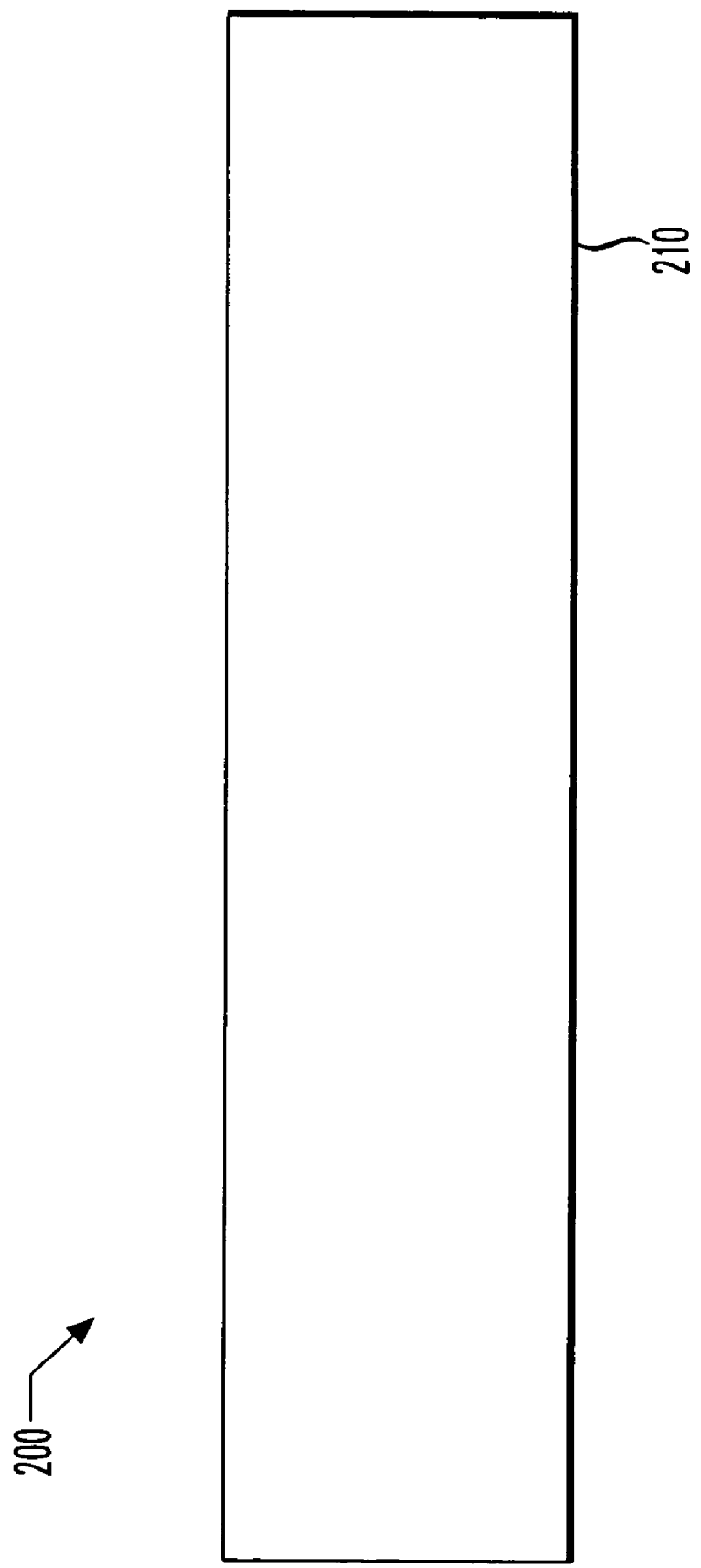
FIG. 2 illustrate sectional views of a natural semiconductor substrate on which isotopically enriched semiconductor material layers may be deposited.

Turning now to FIG. 2, there is illustrated a sectional view of a wafer 200 over which semiconductor devices, as those briefly discussed above, can be formed. Depending on the embodiment, the substrate 210 of the wafer 200 may be comprised of either silicon, germanium, or combinations or alloys thereof. However, by way of an example only, discussion herein will be directed to an embodiment where silicon is used to construct the substrate 210. As mentioned above, natural silicon is composed of several silicon isotopes, and more specifically, approximately 92.2% of silicon 28 ($^{28}$Si), 4.7% of silicon 29 ($^{29}$Si), and 3.1% of silicon 30 ($^{30}$Si). The thickness of the substrate 210 may vary somewhat, but typically, the substrate 210 has a thickness of about 625 micrometers. In conventional structures, the substrate 210 serves as a foundation on which a natural silicon epi layer is formed and appropriately doped to form well and source/drains for active devices, such as transistors. However, in the present invention, the substrate 210 may or may not serve as the ultimate foundation or base layer for the semiconductor device, since, in some embodiments, have to be removed.

Figure 3:
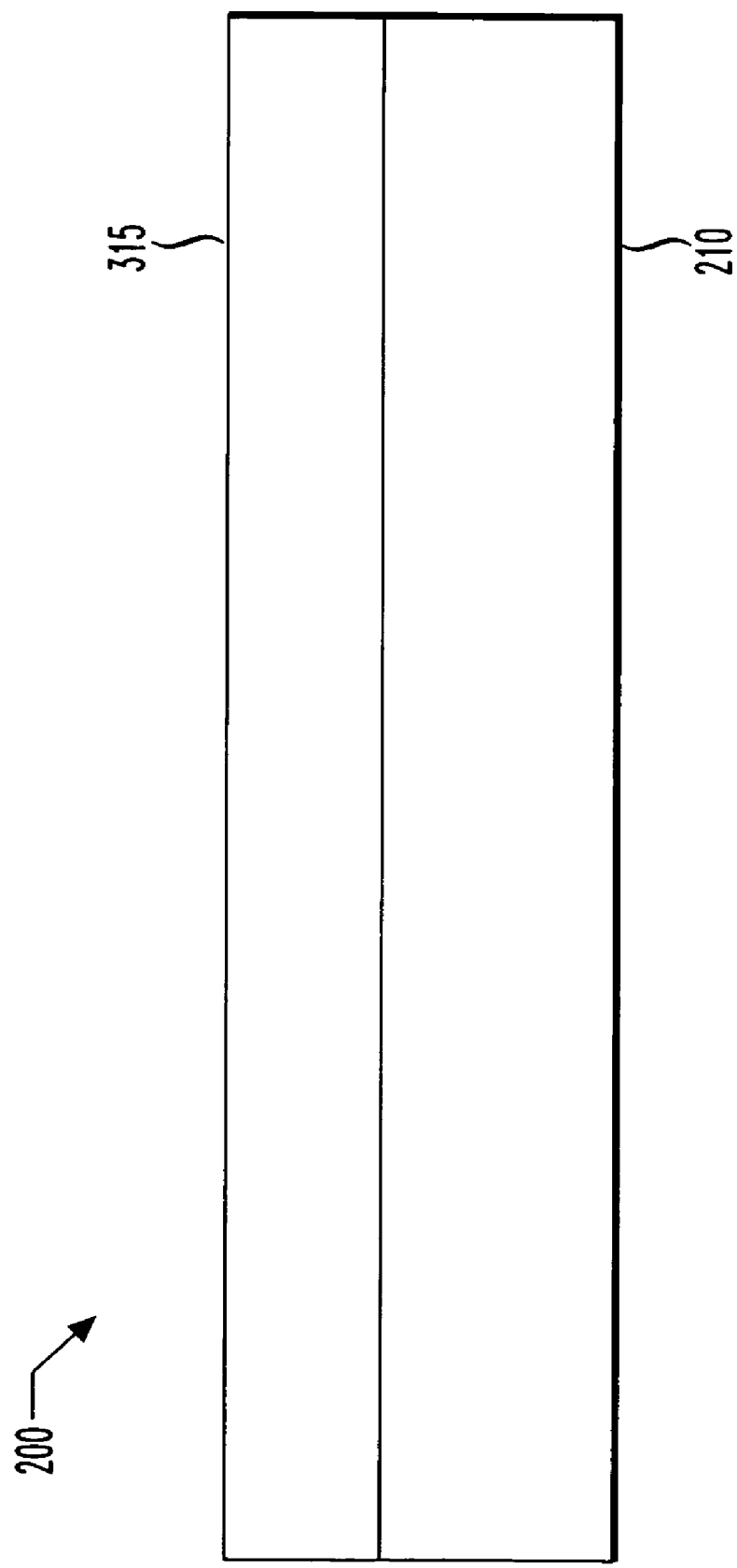
FIG. 3 illustrates a sectional view of the substrate of FIG. 2 after deposition of a doped, isotopically enriched material layer has been deposited.

Turning now to FIG. 3, there is illustrated a sectional view of the wafer 200 after deposition of a first isotopically enriched layer 315 which includes an isotopically enriched semiconductor material, such as $^{28}$Si, $^{74}$Ge, or combinations or alloys thereof. In one embodiment, the isotopically enriched semiconductor material is $^{28}$Si. In one aspect, $^{28}$Si accounts for at least about 93% of the silicon present in the first isotopically enriched layer 315 is $^{28}$Si, and in other embodiments it accounts for at least about 99.9% of the silicon present in the first isotopically enriched layer 315.

The first isotopically enriched layer 315 is also doped with a dopant. Examples of dopants include p-type dopants or n-type dopants. The concentration of the dopant may vary, but in one embodiment wherein $^{28}$Si is the semiconductor material and boron is the dopant, the dopant concentration ranges from about 1E18 to about 1E20 atoms/cm$^3$, and more preferably is about 1E19 atoms/cm$^3$. However, in other embodiments, one who is skilled in the art would understand what dopants to use with which isotopically enriched semiconductor materials and the corresponding dopant concentrations necessary for any given application. In one embodiment, the first isotopically enriched layer 315 is doped during deposition.

The first isotopically enriched layer 315 may be fabricated by techniques well known to those skilled in the art, such as chemical vapor deposition, molecular beam epitaxy, vapor phase epitaxy, liquid phase epitaxy, atomic layer deposition, or physical vapor deposition techniques or other known methods in the art of semiconductor wafer manufacture. The thickness of the first isotopically enriched layer 315 may vary, but in one embodiment, the deposition is continued until a thickness of about 40 microns is achieved.

The first isotopically enriched layer 315 may be enriched by any number of commercially available methods widely known in the art, including, high speed centrifuge, gaseous diffusion, laser assisted magnetic separation, and various chemical extraction techniques. The selection of a specific technique is dependent upon such factors as cost, mass of the element to be separated, and throughput requirements. The purified isotopes of silicon (e.g., $^{28}$Si) or germanium (e.g., $^{74}$Ge) are obtained by refining the isotope from naturally occurring sources. Acceptable starting materials for silicon are isotopically enriched gases that include silane, monochlorosilane, dichlorosilane, trichlorosilane, silicon tetrachloride, or silicon tetrafluoride. For germanium, acceptable starting materials include germanium tetrachloride, chlorogermanes, or germanium tetrafluoride. These starting materials may be prepared using isotope separation methods as described in U.S. Pat. No. 6,103,942 incorporated herein in its entirety by this reference.

Figure 4:
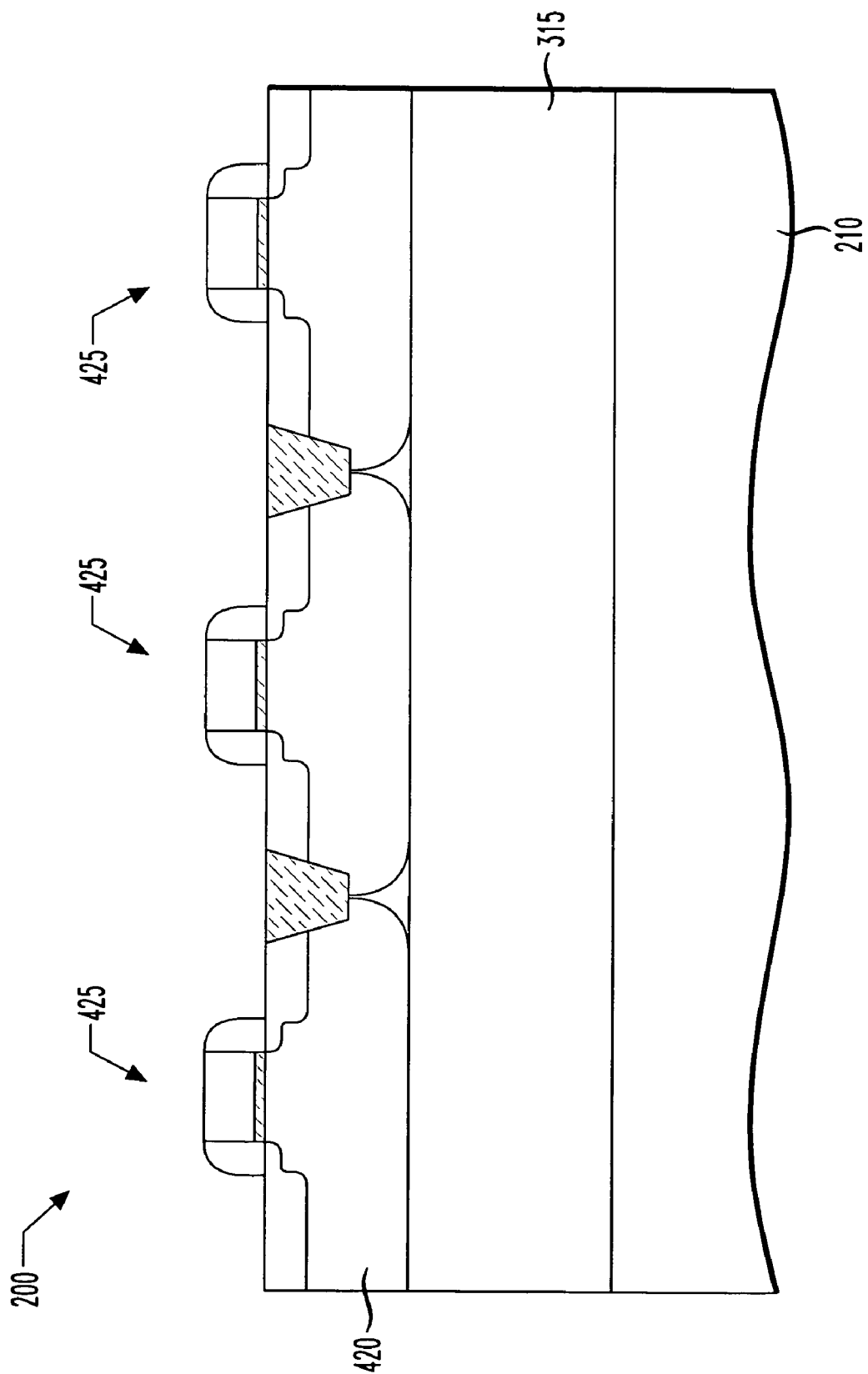
FIG. 4 illustrates a sectional view of the substrate of FIG. 3 after the deposition of a second isotopically enriched material layer has been deposited and active devices have been formed on and within that second isotopically enriched material layer.

Turning now to FIG. 4, there is shown the device 200 of FIG. 3 following the deposition of a second isotopically enriched layer 420. Again, discussion will be directed primarily to the embodiment using isotopically enriched silicon but the other semiconductor materials discussed above may also be used in a similar manner. In this particular embodiment, the $^{28}$Si is deposited using the same methods as discussed above with respect to the first isotopically enriched layer 315 layer, and it makes up at least about 93% of the silicon present in the second isotopically enriched layer 420 in one embodiment. In another embodiment, however, the $^{28}$Si makes up at least about 99.9% of the silicon present in the second isotopically enriched layer 420. In fact, the formation of the second isotopically enriched layer 420, in one embodiment, may be just a continuation of the deposition process used to form the first isotopically enriched layer 315. However, in this case, the second isotopically enriched layer 420 is not intentionally doped. It should be understood that while the second isotopically enriched layer 420 is not intentionally doped, it may become doped with the same type dopant used to dope the first isotopically enriched layer 315, or alternatively, it may be doped intentionally. Again, the resulting dopant concentration may vary, but in one embodiment where the dopant is boron, the dopant concentration may range from about 1E13 to about 2E15 atoms/cm$^3$ or less, and in certain cases the concentration will be about 1E15 atoms/cm$^3$. As with the first isotopically enriched layer 315, the thickness of the second isotopically enriched layer 420 may vary, but in one aspect, the resulting thickness is about 10 microns, that is within ±5 microns.

The second isotopically enriched layer 420 serves as the active device or epi layer in which or on which active devices may be formed as shown above in FIG. 1 and discussed above. The epi layer may be expitaxially grown using conventional techniques. A device is still considered to be formed on the second isotopically enriched layer 420 even though thin material layers, such as thin insulating layer may separate portions of the active device from the second isotopically enriched layer 420. Additionally, while only two isotopically enriched layers 315, 420 have been shown, other embodiments contemplate the use of multiple isotopical layers.

Following the formation of the second isotopically enriched layer 420, active devices 425, as those discussed above and shown in FIG. 1, are then conventionally formed on and within the second isotopically enriched layer 420, as shown. Following the conventional formation of the active devices 425, the substrate layer 210 may be removed by using conventional processes, such as chemical or mechanical grinding/etching processes. This step, however, is optional and may not be conducted in some embodiments. However, in those embodiments where the substrate layer 210 is removed, the first isotopically enriched layer 315, because it is doped, may be used as a back side electrical contact for the active devices 425. Removal of the substrate layer 210 results in the embodiment shown in FIG. 1.

Figure 5:
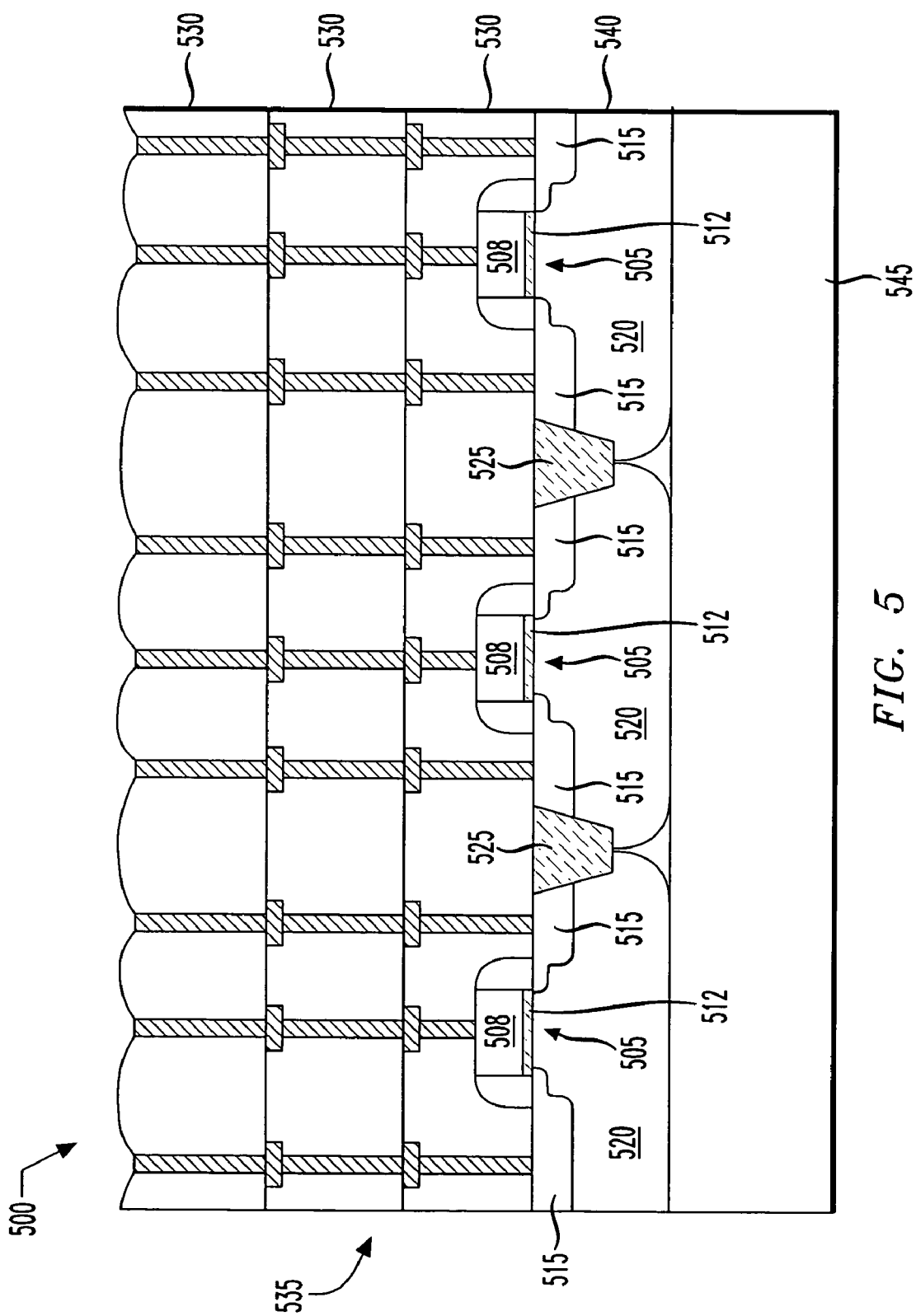
FIG. 5 illustrates a partial sectional view of an integrated circuit that incorporates the substrates and active devices of FIG. 4 therein.

Turning now to FIG. 5, there is illustrated an integrated circuit 500 into which the active devices shown in FIG. 4 may be incorporated. The integrated circuit 500 includes active devices 505, such as transistors. The gates 508 are designed to operate at their respective designed operating voltages. The gates 508 are electrically each isolated by a gate dielectric 512. The active devices 505 also each include source/drains 515 formed in wells 520, which can be doped as desired. Conventional isolation structures 525 separate and electrically isolate the active devices 505 from each other. Interlevel dielectric layers 530 are located over the active devices 505 and interconnects 535 are formed therein to interconnect the various active devices 505 to form an operative integrated circuit. The active devices are formed on the second isotopically enriched layer 540 and over the first isotopically enriched layer 545, as discussed above. Given the teachings of the present application, one who is skilled in the art would know how to form the operative integrated circuit as shown in FIG. 5.

Although the present invention has been described in detail, one of ordinary skill in the art should understand that they can make various changes, substitutions and alterations herein without departing from the scope of the invention.

What is claimed is:

1. A process for manufacturing a semiconductor device, comprising:
   forming a first doped layer of an isotopically enriched semiconductor material over a foundational substrate, said first doped layer having a first dopant concentration;
   forming a second layer of isotopically enriched semiconductor material over and in contact with said first doped layer, said second layer having a second different dopant concentration; and
   constructing active devices on said second layer.

2. The process as recited in claim 1, further including removing said foundational substrate.

3. The process as recited in claim 1, wherein said first doped layer and said second layer are isotopically enriched with silicon 28 ($^{28}$Si).

4. The process as recited in claim 3, wherein said $^{28}$Si accounts for greater than about 93% of silicon present in each of said first doped layer and said second layer.

5. The process as recited in claim 1 wherein said first doped layer and said second layer are epitaxially deposited over said foundational substrate, and said first doped layer is doped during said epitaxial deposition.

6. The process as recited in claim 5 wherein said second layer is also doped.

7. The process as recited in claim 1 wherein forming said first and second doped layers includes forming said first doped layer to a thickness of about 40 microns and forming said second layer to a thickness of about 10 microns.

8. A process, for manufacturing a semiconductor device, comprising:
   forming a first doped layer of an isotopically enriched semiconductor material over a foundational substrate, said first doped layer having a dopant concentration ranging from about 1E18 to about 1E20 atoms/cm$^3$;
   forming a second doped layer of isotopically enriched semiconductor material over and in contact with said first doped layer wherein said second layer is doped to a concentration ranging from about 1E13 to about 2E15 atoms/cm$^3$; and
   constructing active devices on said second layer.

9. A semiconductor device, comprising:
   a first doped layer of an isotopically enriched semiconductor material, said first doped layer having a first dopant concentration;
   a second layer of isotopically enriched semiconductor material located over and in contact with said first doped layer, said second layer having a second different dopant concentration; and
   active devices located on said second layer.

10. The semiconductor device as recited in claim 9 wherein said first doped layer is a support layer that serves as an electrical back contact for said semiconductor device.

11. The semiconductor device as recited in claim 10 wherein said first doped layer and said second layer are isotopically enriched with silicon 28 ($^{28}$Si).

12. The semiconductor device as recited in claim 10 wherein said $^{28}$Si accounts for greater than about 93% of silicon present in each of said first doped layer and said second layer.

13. The semiconductor device as recited in claim 9 wherein a thickness of said first doped layer is about 40 microns and a thickness of said second layer is about 10 microns.

14. A semiconductor device comprising:
- a first doped layer of an isotopically enriched semiconductor material, said first doped layer having a dopant concentration ranging from about 1E18 to about 1E20 atoms/cm$^3$;
- a second doped layer of isotopically enriched semiconductor material located over and in contact with said first doped layer, said second having a dopant concentration ranging from about 1E13 to about 2E15 atoms/cm$^3$; and
- active devices located on said second layer.

15. The semiconductor device as recited in claim 14 wherein said first and second doped layers are doped with a p-type dopant or an n-type of dopant.

16. An integrated circuit comprising:
- a first doped layer of isotopically enriched silicon, said first doped layer having a first dopant concentration;
- a second doped layer of isotopically enriched silicon located over and in contact with said first doped layer, said second doped layer having a second different dopant concentration; and
- active devices located on or within said second doped layer;
- dielectric layers located over said active devices; and
- interconnects located in dielectric layers and interconnecting said active devices to form an operative integrated circuit.

17. The integrated circuit as recited in claim 16 wherein said first doped layer is a base layer and an electrical back contact for said integrated circuit.

18. The integrated circuit as recited in claim 16 wherein said first and second doped layers are isotopically enriched silicon with silicon 28 ($^{28}$Si).

19. The integrated circuit as recited in claim 16 wherein said first doped layer is doped to a dopant concentration of about 1E19 atoms/cm$^3$.

20. The integrated circuit as recited in claim 16 wherein a thickness of said first doped layer is about 40 microns and a thickness of said second doped layer is about 10 microns.

\* \* \* \* \*